United States Patent [19]

Allen et al.

[11] Patent Number: 4,705,205

[45] Date of Patent: * Nov. 10, 1987

[54] CHIP CARRIER MOUNTING DEVICE

[75] Inventors: Leslie J. Allen, Swindon, England; Gabe Cherian, Fremont; Stephen H. Diaz, Los Altos, both of Calif.

[73] Assignee: Raychem Corporation, Menlo Park, Calif.

[*] Notice: The portion of the term of this patent subsequent to May 12, 2004 has been disclaimed.

[21] Appl. No.: 610,077

[22] Filed: May 14, 1984

Related U.S. Application Data

[63] Continuation-in-part of Ser. No. 509,684, Jun. 30, 1983.

[51] Int. Cl.$^4$ .................. H01L 21/60; H01L 21/58
[52] U.S. Cl. ......................... 228/180.2; 228/56.3; 228/185; 439/70; 439/876
[58] Field of Search ............. 228/56.3, 180.2, 185; 174/94 R; 361/408; 339/17 CF, 17 N, 29 R, 275 B; 29/854

[56] References Cited

U.S. PATENT DOCUMENTS

| | | | |
|---|---|---|---|
| 3,070,650 | 12/1962 | Stearns | 174/94 R |
| 3,148,310 | 9/1964 | Feldman | 317/101 |
| 3,373,481 | 3/1968 | Lins et al. | 29/471.3 |
| 3,467,765 | 9/1969 | Croft | 339/275 B |
| 3,472,365 | 10/1969 | Tiedema | 228/56.3 |
| 3,591,839 | 7/1971 | Evans | 317/234 |
| 3,616,532 | 11/1971 | Beck | 29/625 |
| 3,680,037 | 7/1972 | Nellis et al. | 339/61 M |
| 3,795,884 | 3/1974 | Kotaka | 339/17 LM |
| 3,811,186 | 5/1974 | Larnerd et al. | 29/626 |
| 3,839,727 | 10/1974 | Herdzik et al. | 357/71 |
| 3,861,135 | 1/1975 | Seeger, Jr. et al. | 174/88 R |
| 3,862,791 | 1/1975 | Miller | 339/198 R |
| 3,871,015 | 3/1975 | Lin et al. | 29/589 |
| 3,900,153 | 8/1975 | Beerwerth et al. | 228/246 |
| 3,921,285 | 11/1975 | Krall | 29/626 |
| 3,926,360 | 12/1975 | Moister, Jr. | 228/180.2 |
| 3,991,463 | 11/1976 | Squitieri et al. | 339/17 M |

(List continued on next page.)

FOREIGN PATENT DOCUMENTS

| | | |
|---|---|---|
| 0083436 | 12/1982 | European Pat. Off. |
| 55-53431 | 4/1980 | Japan |
| 55-61032 | 4/1980 | Japan |
| 861242 | 2/1961 | United Kingdom |
| 1017650 | 1/1966 | United Kingdom |
| 1112693 | 5/1968 | United Kingdom |
| 1113005 | 5/1968 | United Kingdom |
| 2113134B | 12/1981 | United Kingdom |

OTHER PUBLICATIONS

Abolafia "Chip Interconnection Device", *IBM Tech. Disclosure Bulletin;* vol. 15, No. 2; 7/1972; p. 420.
Druschel et al, "Integrated Stacking Spacer", *IBM Tech. Disclosure Bulletin;* vol. 21, No. 6; 11/1978; pp. 2322–2324.
"Data Sheet CEC-011", Technical Wire Products, Inc.; Santa Barbara, Calif.; 1974.
A Guide to Preform Soldering, Alloys Unlimited Inc., 1959.

*Primary Examiner*—Kenneth J. Ramsey
*Attorney, Agent, or Firm*—T. Gene Dillahunty

[57] ABSTRACT

A chip carrier mounting device which is hereinafter also referred to as an "interconnection preform placement device" includes a retaining member having a predetermined pattern of apertures in which are positioned preforms of joint-forming material such as solder. The preform retains its general configuration after the interconnection or soldering process to form a resilient joint which is more capable of withstanding stress, strain and fatigue. A method of forming resilient interconnections comprises placing the interconnection retaining member device between parallel patterns of electrically conductive elements, such as the conductive pads on an electronic component and a circuit board, and effecting the bonding of the conductive elements with the preforms. The joint-forming material may be a filled solder composition or a supported solder which substantially maintain their physical shape when the solder is molten, or a conductive elastomer.

27 Claims, 20 Drawing Figures

U.S. PATENT DOCUMENTS

| | | | |
|---|---|---|---|
| 4,003,621 | 1/1977 | Lamp | 339/DIG. 3 |
| 4,027,936 | 6/1977 | Nemoto et al. | 339/DIG. 3 |
| 4,064,623 | 12/1977 | Moore | 339/DIG. 3 |
| 4,067,104 | 1/1978 | Tracy | 228/188 |
| 4,089,575 | 5/1978 | Grabbe | 339/17 CF |
| 4,109,378 | 8/1978 | Davies | 29/629 |
| 4,130,327 | 12/1978 | Spaulding | 339/17 CF |
| 4,179,802 | 12/1979 | Joshi et al. | 29/589 |
| 4,195,193 | 3/1980 | Grabbe et al. | 174/52 FP |
| 4,201,435 | 5/1980 | Nakamura et al. | 339/17 M |
| 4,209,893 | 7/1980 | Dyce et al. | 29/522 |
| 4,240,198 | 12/1980 | Alonso | 29/876 |
| 4,290,195 | 9/1981 | Rippere | 228/248 |
| 4,295,700 | 10/1981 | Sado | 339/61 M |
| 4,334,727 | 6/1982 | Scheingold et al. | 339/17 CF |
| 4,354,629 | 10/1982 | Grassauer et al. | 228/56 |
| 4,390,220 | 6/1983 | Benasutti | 339/17 CF |
| 4,402,450 | 9/1983 | Abraham et al. | 228/170 |
| 4,402,562 | 9/1983 | Sado | 339/61 M |
| 4,412,642 | 11/1983 | Fisher, Jr. | 228/173 |
| 4,433,887 | 2/1984 | Sado et al. | 339/17 R |
| 4,458,968 | 7/1984 | Madden | 339/17 CF |
| 4,487,638 | 12/1984 | Hoge | 148/24 |

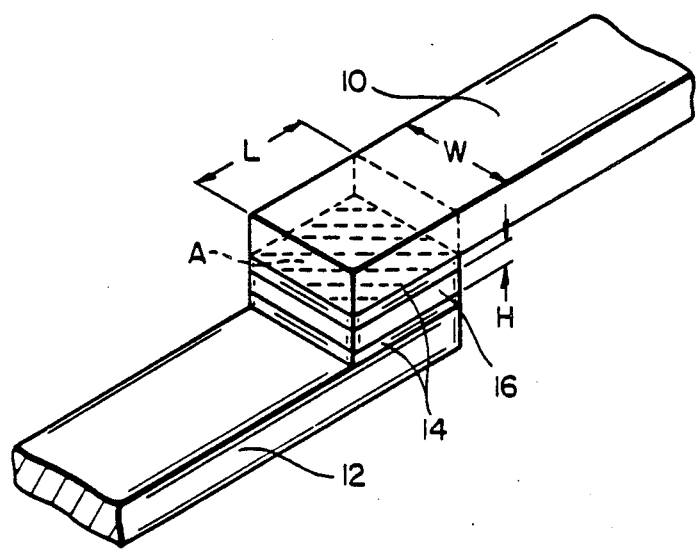
FIG_1
*(PRIOR ART)*
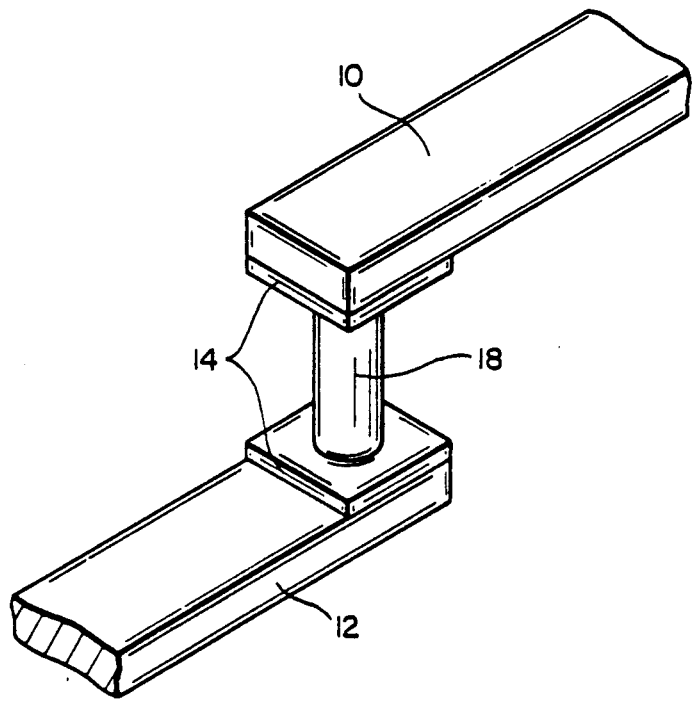
FIG_2

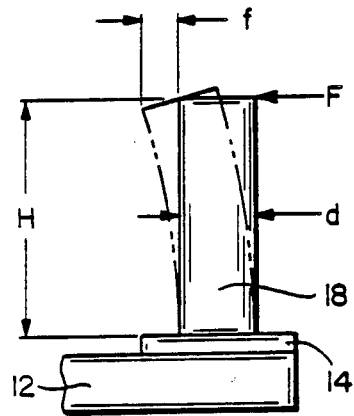
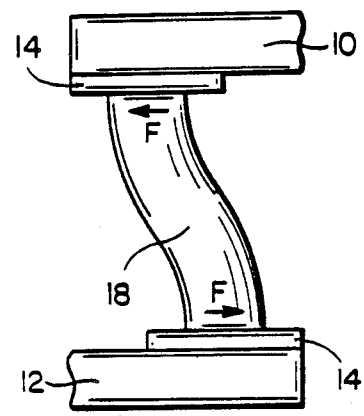
FIG_3A  FIG_3B
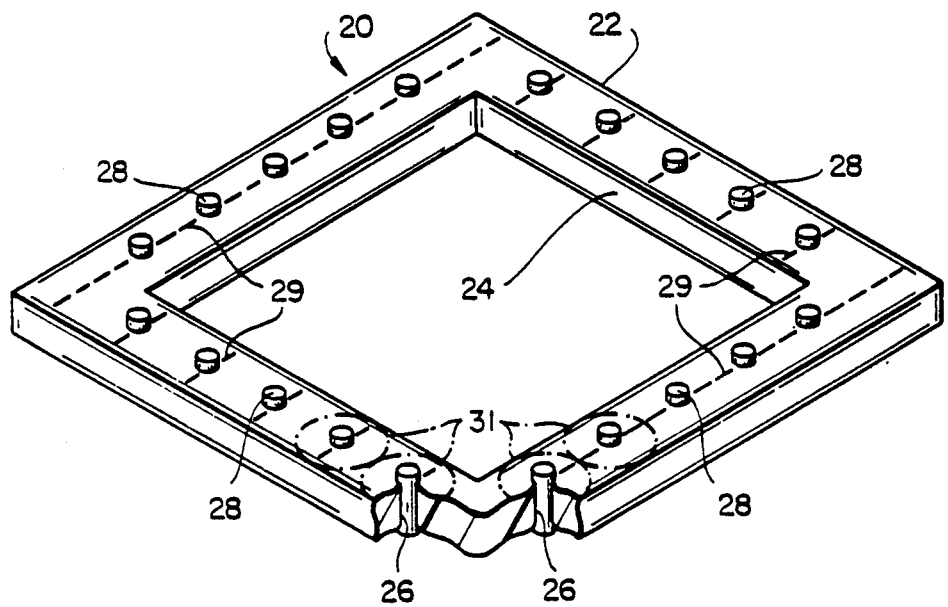
FIG_4

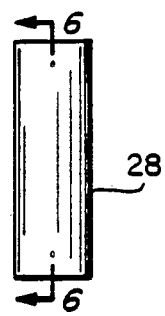
FIG_5
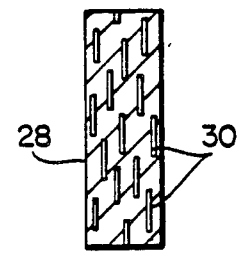
FIG_6
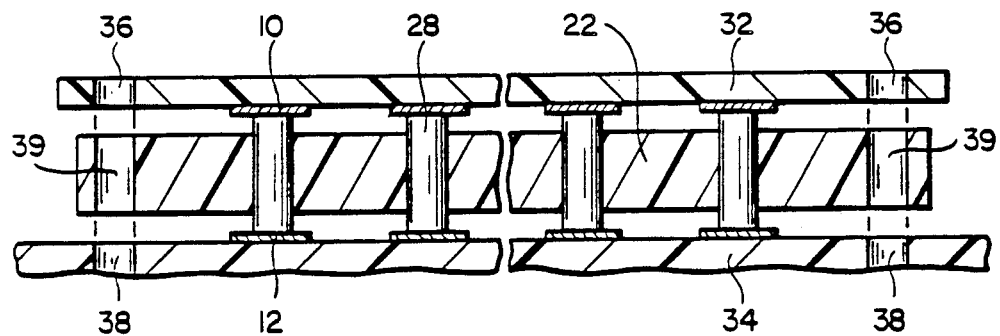
FIG_7
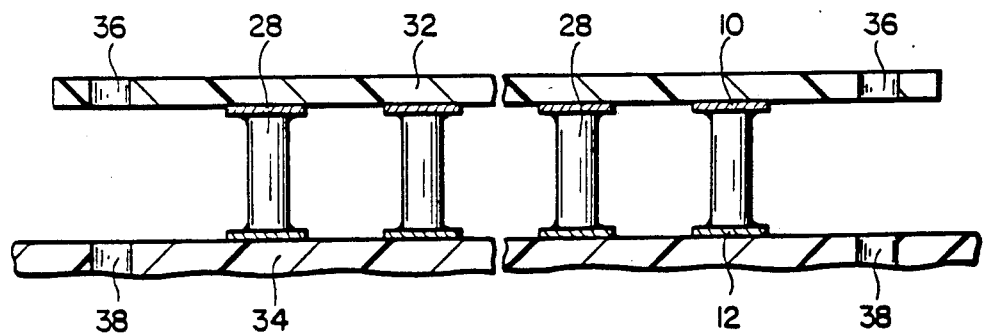
FIG_8

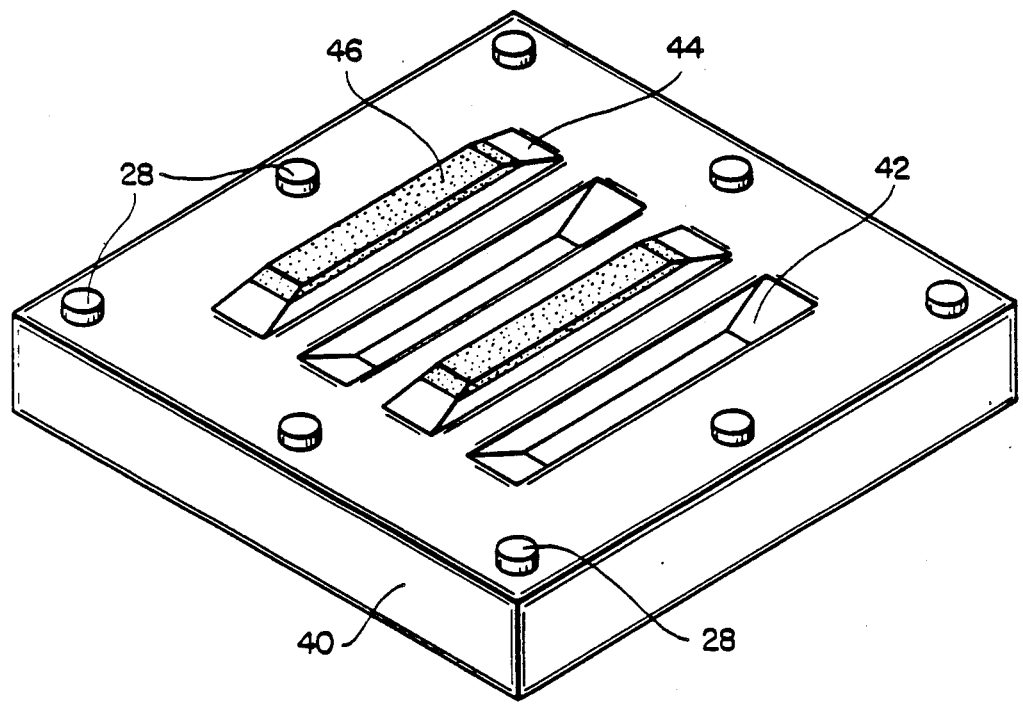
FIG_9
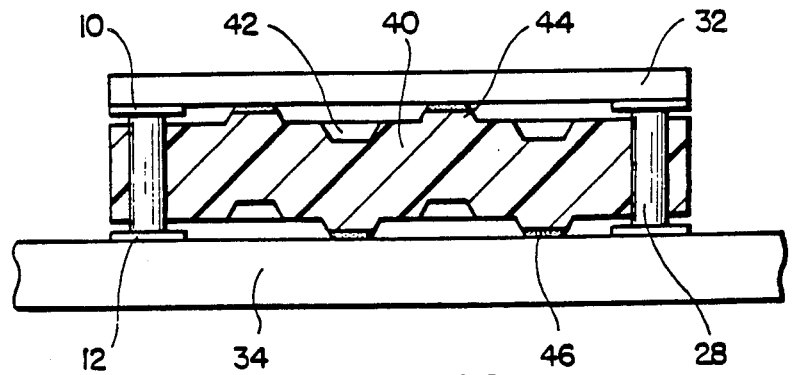
FIG_10

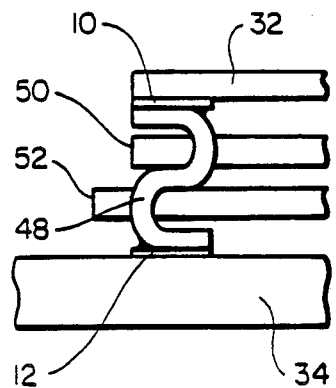
FIG_11A
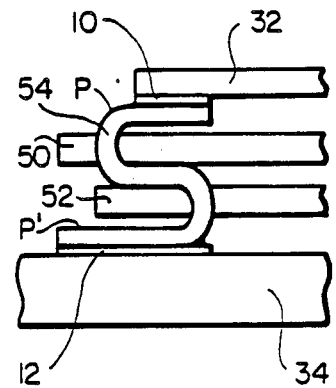
FIG_11B
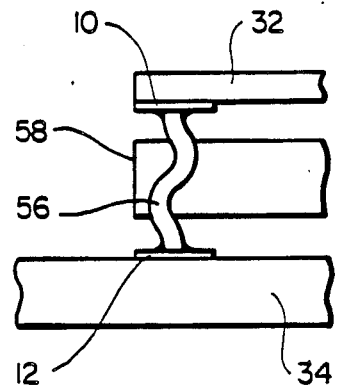
FIG_11C
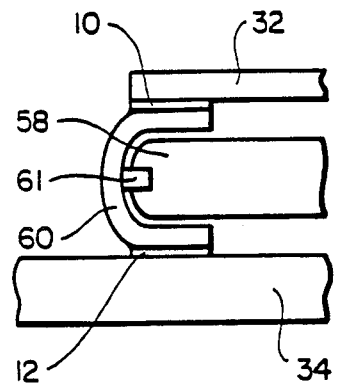
FIG_12
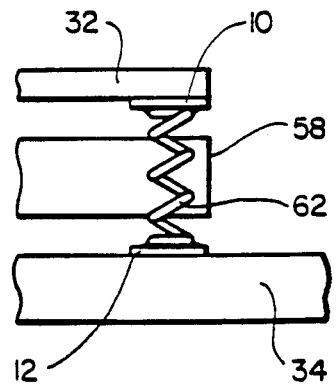
FIG_13

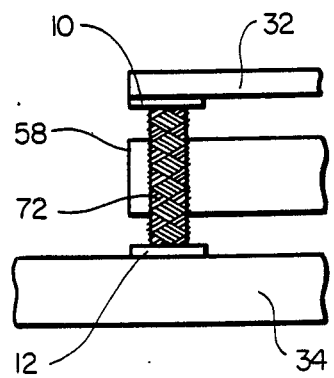
FIG_14A
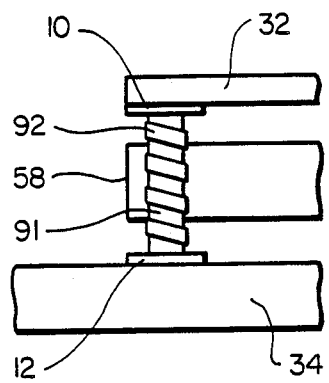
FIG_14B
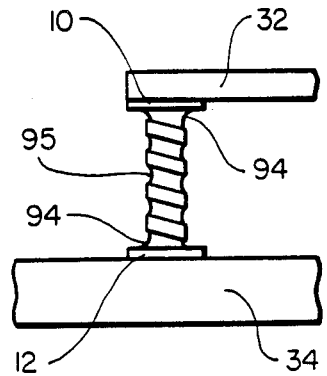
FIG_14C
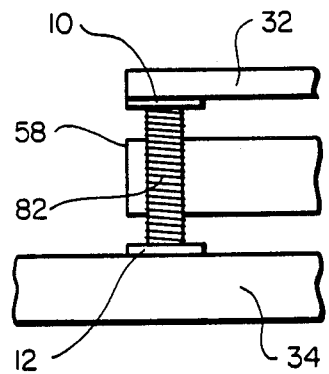
FIG_14D

CHIP CARRIER MOUNTING DEVICE

RELATED APPLICATION

This application is a continuation in part of U.S. Application Ser. No. 509,684 filed June 30, 1983, which is incorporated herein by reference.

BACKGROUND OF THE INVENTION

This invention relates to electrical interconnections, and to methods, devices and materials for forming such interconnections. More particularly, the invention is directed to methods, devices and materials for attaching electronic components, especially chips or chip carrier packages, to each other or to supporting substrates, such as circuit boards.

The microelectronics industry is steadily moving toward the use of large chips and chip carrier packages (CCP) which have connection pads on the faces and/or edges. These are generally used where there are limitations with the use of dual inline packages (DIP). The number of connections on the most popular packages can range from 64 to 156. Chip carrier packages can be produced with leads attached (leaded) or they can be leadless.

Leaded CCPs can be soldered directly onto printed circuit boards (PCB) or printed wire boards (PWB). Leadless CCPs can be soldered onto ceramic boards or installed into connectors. However, with glass/epoxy printed circuit boards or printed wire boards, leadless CCPs are usually mounted into connectors which are in turn mounted on the PCBs because of the effect of the different thermal expansion coefficients of the materials involved when subjected to temperature fluctuations. These connectors are complex to manufacture and costly to use. As used herein "electrically conductive elements" is intended to include CCP, PCB, PWB and other electronic or electrical components.

As the CCP technology improves and their reliability increases, more emphasis is directed to soldering these packages directly onto the PCBs to make more use of the board space, and dispensing with the connectors even though the use of connectors permits replacement of faulty CCPs. The cost of conventional connectors relative to the cost of the CCPs can be disproportionately high. This is a strong incentive to use CCPs without connectors.

However, the direct soldering of CCPs on PCBs without the use of connectors is associated with a number of problems. (1) The variation of the surface flatness and non-parallel contours between the CCP and the boards produces varying solder joint heights. (2) The solder will have a tendency to wick out of the joint area into crevices or castellations in the CCP, thus "starving" the joint area. (3) Gold alloying with the solder will produce embrittlement of the "starved" joint. (4) Differential thermal expansion between the CCP and the board will fracture a thin solder joint due to the high shear strains in the joint. (5) Bridging between joints may occur if excess solder is present or if the distance between the joints is small. (6) Solder location tolerances are small and getting smaller yet with increasing packaging density, with a typical connection pad having a width of 0.012 inches and 0.022-inch center-to-center spacing. (7) Flux removal from the space between the CCP and the PCB and subsequent inspection thereof. (8) The solder pastes used to attach the CCP will produce loose solder balls which cause electrical problems.

Different solutions have been proposed for the foregoing problems. The proper positioning of a predetermined quantity of solder may be achieved with the use of solder preforms spaced on a carrier or template in the locations corresponding to the points where the solder joints are to be formed. Examples of this technique may be found in U.S. Pat. Nos. 3,320,658, issued to Bolda et al; 3,396,894, issued to Ellis; 3,472,365, issued to Tiedema; 3,719,981, issued to Steitz; 3,744,129, issued to Dewey; 4,209,893, issued to Dyce et al.; and 4,216,350, issued to Reid.

Dyce et al. and Reid relate more specifically to the use of ring-type solder preforms for the solder connection of pin-type joints. The solder preforms of Dewey are hollow cylinders. Tiedema relates to a flexible carrier ribbon having spaced apertures which receive solder discs to provide a convenient means to handle and transport solder discs.

The Ellis patent discloses a device for simultaneously applying a plurality of solder or other bodies of heat-fusible material, in which the solder bodies are disposed in heat-recoverable cups formed from or positioned on a sheet of material. The cups are spaced to correspond to the location of solder application, and, when heat is applied to the device, the solder melts and the cups recover to a flat configuration, and the recovering cup material forces the solder material out therefrom and into contact with the elements to be soldered.

The Bolda et al. patent provides a thermoplastic carrier sheet onto which a plurality of conductive elements, such as solder preform spheres, are positioned. The individual conductive elements are heated to a temperature which is sufficient to soften the carrier material, but insufficient to deform the conductive elements. During the heating process, the conductive element nestles in the softened thermoplastic material and, upon removal of the heat, the carrier material resolidifies and rigidly supports the conductive elements. When the solder ball carrier assembly is used, heat is applied to melt the solder ball and soften the thermoplastic carrier material, permitting the material to form an insulation between those portions of the electrical conductors not electrically interconnected by the solder elements.

Another approach has been proposed by Bell Laboratories which is developing techniques employing vacuum equipment to pick up and place small solder balls on the underside of the CCPs, and retaining them by using a solid phase bonding method. Additional information may be found in the paper by R. H. Minetti entitled "Solid Phase Solder Bonding for Use in the Assembly of Microelectronic Circuits."

Steitz provides a method of joining solder balls to solder bumps spaced on a semiconductor flip chip by forming an array of solder balls on the tacky side of a pressure-sensitive tape, with the balls being spaced like the solder bumps. The array of solder balls is placed in contact with the solder bumps, and both are then heated to reflow the solder and cooled to fix the contacts after which the tape is removed.

Other examples of solder packs and solder preforms are in U.S. Pat. Nos. 3,040,119 to Granzow; 3,535,769 to Goldschmid; 3,750,265 to Cushman; 4,099,615 to Lemke et al. and 4,142,286 to Knuth et al. U.S. Pat. No. 3,982,320 to Buchoff et al. discloses electrically conductive connectors constructed from non-conductive and conductive elastomers.

In U.S. Pat. No. 3,614,832, Chance et al. form connections between the contacts on a solid-state device and conductive lands on a substrate by placing a decal over the device, the decal having a plurality of conductive strips attached adhesively to a backing sheet. Application of heat and pressure effects bonding of the strips, after which the adhesive is dissolved and the decal removed.

Although the foregoing techniques provide for the correct placement of a predetermined quantity of solder or other suitable joint-forming material, and with the proper dimensioning of the carrier or template, sufficiently small quantities of solder can be positioned on close spacing between centers, these proposals do not address the problem of high shear strains in the solder joints.

As noted above, among the factors considered in forming acceptable electrical connections between the CCP and the PCB is that the connections must be able to withstand stresses developed due to the effect of temperature fluctuations and the differences in thermal expansion coefficients between the material of the CCP and the substrate or circuit board on which it is mounted. Thus, a CCP may be made of a ceramic material and the circuit board may be made of an epoxy-glass composition, and when subjected to elevated temperatures these elements will expand at different rates, inducing stresses in the connections.

Even if the materials used in the CCP and the circuit board have thermal expansion coefficients which are close in value to minimize the differential expansion effects, heating/cooling cycles which result when power is applied across the CCP induce a temperature differential between the CCP and the PCB to produce stresses in the joints.

It is well known, and as summarized below, that if the solder joint is formed into a "long" column configuration in which the height of the column is much greater than the diameter or transverse dimension of the joint, less stress is induced in the joint and consequently the joint has greater reliability and longer life.

In the patent to Krall, U.S. No. 3,921,285, a method is described for joining microminiature components to a carrying structure in which the height of the electrical connections may be adjusted during original joining of the component to the carrying structure or in a two-step solder reflow process. The method involves the elongation of the solder joints between the component and its carrier, and is accomplished by the use of a vaporizable material which is either liquid at room temperature or becomes liquid before the solder melts. A bridge is positioned over the component and the vaporizable material is placed between the bridge and the component surface opposite the surface on which the connections are formed. Heating to achieve soldering causes the material to vaporize, and the combined action of vaporization and surface tension pulls the component closer to the bridge, which in turn elongates the solder joint. Upon cooling the joint remains fixed in its elongated shape.

While Krall provides for elongated solder joints, the device is structurally complex and difficult to use. Specifically, an additional lifting structure is required to operate while the solder is in a molten state. If the motion of the lifting device is too great, or if the solder quantities are not uniform, then some solder joints may be ruptured. Additionally, the lifting structure is an obstacle to cleaning and inspection.

In U.S. Pat. No. 4,412,642 to Fisher leadless chip carriers are converted to "cast-leaded chip carriers" by molding high melting point leads to the chip carrier. Those leads are then soldered to a board by conventional means. Additional examples of methods and devices for interconnecting chip carriers and boards are shown in U.S. Pat. Nos. 3,373,481 to Lins et al., 3,680,198 to Wood, 3,811,186 to Larnerd et al. and 4,179,802 to Joshi et al. Joshi et al. uses studs to provide sufficient space under the chip carrier for cleaning. The Krall and Larnerd et al. methods are exemplary of what is known as the "controlled collapse" and "self-stretching" techniques.

Other methods of attaching electronic components, include the pin solder terminals of U.S. Pat. No. 3,750,252 to Landman and the collapsed springs of U.S. Pat. No. 3,616,532 to Beck. Other examples of soldering chip carriers to boards include U.S. Pat. Nos. 3,392,442 to Napier et al., 3,401,126 to Miller et al., 3,429,040 to Miller, 3,355,078 to Smith, 3,859,723 to Homer et al. and 3,614,832 to Chance et al.

The above disclosures address the problem of connections which must be able to withstand the stresses from thermal cycles, none disclose a satisfactory solution which both solves the problem and is suitable for reliable manufacturing processes.

In the above disclosures the solder used is conventional solder which readily flows when molten. The flow is usually of a capillary nature when the solder is on a wettable surface, such as a pre-tinned contact lead. Such conventional solder has a high surface tension tending to make the molten solder form balls when on a non-wettable surface or when positioned on a small area of wettable surface, such as an electrical contact pad, and surrounded by a non-wettable surface, such as epoxy board or ceramic substrate. In some applications a varnish or epoxy material is applied to areas to render them non-wettable by the solder or to enhance the non-wettable character of the area and keep the solder on the desired surface through its inherent surface tension. However, when the mass of the solder is too great for the available wettable surface, the solder will flow across the non-wettable surfaces and may bridge nearby electrical contacts.

Solder has been used in various forms and compositions for a variety of purposes. In U.S. Pat. No. 1,281,126 to Bevan a solder material containing metal powder, filings or shavings was used to cover holes. U.S. Pat. No. 1,291,878 to Hess discloses a compressed pack of solder filaments combined with flux material and a metal foil cover in a rope or other form convenient for conventional soldering. U.S. Pat. No. 1,564,335 to Feldkamp discloses a fuse element made from copper particles compressed into a block and immersed in solder to produce an element which will quickly drop away from the fuse body when the circuit is overloaded. U.S. Pat. Nos. 2,431,611 to Durst and 3,163,500 to Konrad et al. disclose incorporating higher melting metals in solder to make a material which will readily flow upon melting and which will form a joint having higher strength when solid. U.S. Pat. No. 3,467,765 to Croft discloses a solder containing refractory particles to stabilize the microstructure of the solder composition when solid but which does not interfere with the capillary flow of the solder when liquid. U.S. Pat. Nos. 3,605,902 and 3,638,734 to Ault disclose solder which is reinforced internally or externally to prevent cold flow of the solid solder but which will readily flow and collapse upon melting. U.S. Pat. No. 3,900,153 to Beerwerth et al. discloses solder containing a small amount of spherical particles to provide spacing between electrical contacts and increase the thickness of the layer of solder in the connection. U.S. Pat. No. 4,290,195 to Rippere discloses forming connections in multilayer circuit boards using copper particles wherein the particles are coated with a small amount of solder.

OBJECTS OF THE INVENTION

It is a primary object of the present invention to provide a device and a method for the precise placement of a predetermined quantity of material for the formation of a solder-type connection between electrically-conductive elements.

Another object of the invention is to provide a connection-forming material which will sufficiently retain its shape at melting temperatures to form structural and electrical connection between electrically conductive elements.

Another object of the invention is to provide an apparatus and a method of the foregoing type for the placement of a connection-forming material having a predefined configuration.

Another object of the invention is to provide an apparatus and a method of the foregoing type for the placement of a connection-forming material preform having a height dimension greater than its transverse dimension.

Yet another object of the invention is to provide an apparatus and a method of the foregoing type for the formation of solder-type connections which are resilient and better able to withstand fatigue or repetitive thermal cycling.

Still another object of the invention is to provide an apparatus and a method of the foregoing type for the simultaneous formation of a plurality of resilient solder-type connections between a plurality of parallel-disposed electrically-conductive elements.

A further object of the invention is to provide an apparatus and a method to attach an electronic component to a circuit board.

Yet a further object of the invention is to accurately align the CCP with the PWB.

A specific object of the present invention is to provide apparatus, materials and methods to attach an electronic component to a circuit board with resilient solder joints which are better able to withstand thermal cycling/fatigue stresses, to accommodate dimensional irregularities in the components, the circuit board and the conductive elements thereon and to enable high speed, high reliability manufacture of electronics component—circuit board devices.

SUMMARY OF THE INVENTION

The foregoing and other objects are achieved by one aspect of this invention wherein the interconnection preform placement device of the present invention which includes a retaining member having a predefined pattern of holes or appertures in which are positioned preforms of joint-forming material, such as solder. Each preform is of a predefined configuration and usually has a height greater than its cross-sectional dimension. The preform substantially retains its configuration after the interconnection or soldering process to form a resilient joint which is more capable of withstanding stress, strain and fatigue.

The method of this invention comprises:

positioning a first electrically conductive element in alignment with one side of a retaining member having apertures spaced to correspond to the preselected points on the electrically conductive elements and having disposed in said aperture preforms of electrically conductive joint-forming material;

effecting a bond between one end of the preforms and the preselected points on the first electrically conductive element;

positioning a second electrically conductive element with the opposite side of the retaining member; and effecting a bond between the other end of the preforms and the preselected points on the second electrically conductive element.

The above bonds between the ends of the preforms and the electrically conductive element can be effected simultaneously. The method of this invention can also be performed by placing the interconnection preform placement device i.e., the retaining member having preforms therin, between parallel patterns of electrically-conductive elements, such as the conductive pads on an electronic component and those on a circuit board, and effecting the bonding and interconnection of both of the conductive elements with the preforms simultaneously. The retaining member may be left in the assembled mounting, or it may be designed to be removed afterwards. The retaining member may be left in the assembled mounting to perform a structural, thermal, environmental and/or electrical function.

The joint forming material may be a filled solder composition or a supported solder, which will retain its shape upon the solder melting or reflowing. As used herein the term "filled solder" means a solder material which contains a filler which prevents a shape of the filled solder from changing substantially in dimensions when the temperature of a preformed shape of the filled solder is raised to or above the melting point of the solder. The filler comprises discrete particles or filaments which are solid at temperatures at which the solder is molten. The filler is present in an amount sufficient to substantially maintain the preformed shape of the filled solder when the solder is molten. The filler may be particulate powder or filaments such as discreet lengths of wire or may be a mesh or "wool" of continuous or intermixed filaments. Preferably the filler is electrically conductive and most preferably is a metal. The amount of filler present is that which is sufficient to maintain the preformed shape of the filled solder, such as a column, when the solder is melted or reflowed. The amount is generally from about 20% by weight to about 80% by weight based on the total weight of the solder-filler mixture preferably from about 25% to about 70%, more preferably from about 30% to about 60% and most preferably from about 35% to about 40%.

As used herein the term "supported solder" means a solder preform shape which is supported by a support strand or tape which is disposed about the outside of the solder preform shape. The support strand or tape must be solid at temperatures at which the solder is molten and is disposed about the outside of the preform shape in a pattern whereby the shape of the solder is substantially maintained through the surface tension of the solder when the solder is molten. The pattern in which the support strand or tape is disposed and the spacing, angles, etc. of the pattern will depend on the cross-sectional dimension of the solder preform shape, on the height of the preform shape and on the solder composition due to its apparent surface tension relative to the support strand or tape material. The pattern may be a spiral wrap of tape or wire, a braid of wire or the like, wherein the spacing, for example between the spiral wraps will be governed by the above factors. In general, the supported solder shape will be a column type shape suitable for connecting electrically conductive elements.

As used herein the term "column" means a shape which can form a connection between electrically conductive elements. In general the shape will be cylindrical where the length or height of the column is greater than its cross-section dimension because this configuration provides ease of manufacture and interconnect flexibility for thermal expansion of the electrically conductive elements. The column may be straight, curved, S-shaped, C-shaped, spiraled, etc. The term "column" is also used herein to include shapes wherein the length or height is less than the cross-sectional dimension and any cross-section shape suitable for connecting electrically conductive elements where the distance between the elements is greater than the distance used for conventional capilary flow soldering. The "column" need not be of uniform cross-section dimension, but may vary for flexibility or other reasons, e.g. an hour-glass shape.

As used herein the term "solder" means any conventional or specifically formulated material for forming connection between elements by melting and freezing. Solders are well known as exemplified by the Kirk-Othmer Encyclopedia of Chemical Technology, 3rd Edition (1983), Vol. 21, pages 342–355.

As used herein, the term "apertures" means holes in or through the retaining member. Usually the holes will extend through the retaining member so that the preform of joint-forming material may be placed therein and be exposed at both ends or have both ends extending from the retaining member to form a connection with an electrically conductive element. However, the apertures may be holes in the side or edge of the retaining member which receive a portion of the preform and hold the preform for proper positioning to form an electrical interconnect. These various configurations are illustrated herein.

BRIEF DESCRIPTION OF THE DRAWINGS

The above description, as well as further objects, features and advantages of the present invention, will be more fully appreciated by reference to the following description of presently-preferred but nonetheless illustrative embodiments in accordance with the present invention, when considered in connection with the accompanying drawings, in which:

FIG. 1, labeled Prior Art, represents, on an enlarged scale, a solder joint between a chip device and a circuit board formed in accordance with existing techniques;

FIG. 2 is a showing similar to FIG. 1, illustrating a joint formed with the column-type connection;

FIG. 3A is a representation of the column of FIG. 2 as a cantilevered beam fixed at one end and showing the force acting on it for the purposes of considering the resultant displacement and stresses;

FIG. 3B is a representation of the column of FIG. 2 as a beam fixed at one end and guided at the other and deformed as a result of the relative movement of its ends;

FIG. 4 is a perspective view of one embodiment of the preform placement device of the present invention showing a plurality of column-type solder preforms mounted in a retaining member in the form of a perimeter type carrier element;

FIG. 5 is an elevational view showing one of the column preforms illustrated in FIG. 4;

FIG. 6 is a cross-sectional view along line 6—6 in FIG. 5 showing a column preform containing a filler to maintain its column-type shape;

FIG. 7 is an elevational cross-section showing the preform placement device of FIG. 4 positioned between two structures to be joined, prior to the soldering of the connections;

FIG. 8 is a showing as in FIG. 7, after the solder connections have been formed and the retaining member of the preform placement device has been removed;

FIG. 9 shows another embodiment of the present invention;

FIG. 10 is an elevational view, in section, showing the placement device of FIG. 9 in position after the solder joints have been formed;

FIGS. 11A–C show alternative configurations of the solder preforms useable in connection with the present invention;

FIGS. 12 and 13 show additional configuration for the solder preforms as well as alternate aperture configurations in the retaining member; and FIGS. 14A–D show embodiments of supported solder columns of this invention wherein FIG. 14C shows column after the solder joints have been formed and the retaining member removed.

DESCRIPTION OF THE PREFERRED EMBODIMENTS

In the description herein, the solder joining of a chip carrier package, which is referred to hereafter as a "chip device" or a "chip carrier", and a circuit board is used as an illustrative application of the present invention. The joining of other electronic components is also comprehended, and the invention may be employed wherever and whenever a solder connection of increased reliability and longer life is desired.

Referring to the drawings, and more particularly to FIG. 1, a joint or connecting made in accordance with techniques known in the prior art is shown formed between a chip device 10 and a circuit board 12. The chip device 10 has a plurality of electrical contacts which may be disposed along its edge. Only one contact area is shown for the sake of simplicity. The circuit board 12 has a plurality of complementary contact areas on its surface (only one shown). The circuit board 12 may be a printed circuit board (PCB) or a printed wire board (PWB), and may be referred to hereinafter simply as a "board" or "circuit board." In a known fashion, the chip device will be disposed above the surface of the circuit board such that the contact areas are vertically aligned and mechanically and/or electrically joined, such as with a solder connection. In the illustration of FIG. 1, the opposed, facing surface of the chip device 10 and the circuit board 12 is provided with a layer 14 of conductive material, such as copper, and these layers are interconnected with a suitable solder composition 16, which may be of known tin-lead alloy.

As noted above, a solder connection such as shown in FIG. 1 is subjected to stresses induced by thermal and mechanical forces. These stresses are the result of strains produced by mechanical deformation, differences in temperature between the chip device and the printed circuit board and/or differences in the thermal coefficients of expansion between the chip device and the PCB. For example, thermal stresses may result from power cycling even when the materials of the chip device and circuit board do not exhibit any differences in the coefficient of thermal expansion, but because of the power applied to the chip device, a temperature differential exists between the chip device and the circuit board.

It can be seen that the connection is subjected to repeated heating and cooling cycles, it will ultimately fail due to fatigue, and the connection will fail earlier if the stresses induced therein are high. Therefore, to prolong the life of the joint and to increase its reliability, the resultant stresses therein should be reduced. In order to determine how the stresses can be reduced, the factors governing the creation of the stresses in the joint should be considered.

When the temperature of a CCP mounted on a PWB is raised by $\Delta T$, the length of the CCP increases by the amount $\delta_c$ $$\delta_c = L_c \cdot \alpha_c \cdot \Delta T \tag{1}$$

and the length of the PWB increases by an amount $$\delta_B = L_B \cdot \alpha_B \cdot \Delta T \tag{2}$$

where
 $L_C$=Original length of the CCP
 $L_B$=Original length of the PWB
 $\alpha_c$=Thermal coefficient of expansion of the CCP material
 $\alpha_B$=Thermal coefficient of expansion of the PWB material.

The difference between $B$ and $C$ is the net change in length between the CCP and the PWB due to the T and is defined as $\delta$.

$$\begin{aligned}\delta &= \delta_B - \delta_C \\ &= L_B \cdot \alpha_B \cdot \Delta T - L_C \cdot \alpha_C \cdot \Delta T\end{aligned} \tag{3}$$

So $$\delta = L \cdot \Delta T(\alpha_B - \alpha_C) \tag{4}$$

since $L_B = L_C$.

This change in length between the CCP and the PWB is usually accompanied by an internal force F which causes an elastic/plastic deformation in the three main elements of the assembly, i.e., the CCP, the PWB and the interconnections. It is known to those skilled in the art that if all three of these elements are very stiff then the force F will, of necessity, be high and potentially destructive. It is similarly known that if the stiffness of the interconnections can be reduced (i.e., made more flexible), then there will be a concommittant reduction in the peak force F for any given value of .

The stiffness of the various joint element designs may be approximated as follows:

By definition stiffness is $K = F/f$ where
 F=Applied force
 f=Deflection
 K=Constant of stiffness If H is small, as in the prior art jointing methods illustrated in FIG. 1, then the joint stiffness is:

$$K = (GA/H)$$

where
 G=Shear modulus of elasticity
 A=Joint area
 H=Height of the joint

From this expression it is evident that to reduce the stiffness K of the prior art joint, it is necessary to decrease the area of connection A or the shear modulus of elasticity G or to increase the height H.

The shear stress in the joint may be expressed;

$$\sigma = F/A \tag{5}$$

so if the area of the joint A were decreased to reduce the stiffness, this would simultaneously increase the stress proportionally, as shown by equation (5). Increasing the area of the joint is not generally beneficial and, of course, this strategy would take additional space, thus defeating the primary goal of this type of package, i.e., closer lead spacing.

Increasing the joint height, however, has the benefit of lowering joint stiffness, without an increase in stress.

A more detailed consideration of joints with a larger H dimension, as shown in FIG. 2, will now be undertaken.

If the height H between the opposed surfaces of the conductive paths, such as 10 and 12 in FIG. 1, is relatively large, then the resultant critical stresses are due to bending deformation of the joint. This can be represented as shown in FIG. 2 wherein the joint between the contact 10 and the conductive land 12 is represented by a column 18 of solder. The stresses in the joint can be evaluated by considering the column as a cantilevered beam, fixed at one end, such as to be conductive land 12, with the force F, again assumed to be constant, acting transversely upon the free end of the column. The deflection f at the tip of the beam and the bending stress $\sigma_b$ are given to the well-known equations:

$$f = (FH^3)/(3EI) \tag{2}$$

$$\sigma_b = FH/Z \tag{3}$$

For a round beam, or a round column, the relationship between the section modulus Z and the moment of inertia I is:

$$Z = I/c = 2I/d \tag{4}$$

where $$I = \pi d^4/64 \tag{5}$$

where d is the diameter. The section modulus Z then is:

$$Z = \pi d^3/32 \tag{6}$$

Substitution of equation (5) into equation (2) results in the deflection equation (7) below, and substitution of equation (6) into equation (3) yields the stress equation (8) below:

$$f = \frac{64FH^3}{3\pi E d^4} \tag{7}$$

$$T_b = \frac{32FH}{\pi d^3} \tag{8}$$

The force F in FIG. 3A is produced as the result of dimensional expansion or contraction of the joint due to the thermal cycling, which is represented by the deflection f in equation (7) above. Then, to get the relationship between the deflection and the stress, equations (7) and (8) can be combined as follows:

$$F = \frac{3\pi E d E^4 f}{64 H^3} \quad (9)$$

$$\sigma_b = \frac{3\pi E d f}{2 H^2} \quad (10)$$

From the relationship of the stress $\sigma_b$ given in equation (10) above, it can be seen that in order to reduce this stress, the value of the numerator should be reduced, principally by using a smaller value for d, i.e., decreasing the diameter of the cylindrical column; or by reducing E, i.e., using a more flexible joint material; or by increasing the value of the denominator, such as by increasing the height H of the column. Since the height H is squared, an increase in this parameter from one value to twice that value reduces the stresses in the column to one fourth of the initial level. This indicates that the height H need not be drastically increased in order to get an appreciable reduction in the stresses in the column.

Additionally, by using a somewhat higher column of smaller diameter, not only are the resultant stresses therein reduced, but this permits higher density of joints between the chip devices and the circuit board, a result which is very desirable for increased packing density.

A more rigorous and more exact representation of the deflection of the column shown in FIG. 2 is shown in FIG. 3B, in which one end of the column is fixed and the other end is guided. In this situation, the following relationships exist for the deflections f, and the stresses $\sigma_g$ at each of the two ends and at the center of the beam:

$$f = (FH^3)/(12EI) \quad (11)$$

$$\sigma_g = FH/2Z \quad \text{at ends} \quad (12)$$

$$\sigma_g = 0 \quad \text{at center} \quad (13)$$

Rearranging equations (11), (12) and (13) in the same manner as done previously, the following relationships are obtained for the force F acting on the joint and the stress $\sigma_g$:

$$F = (12EIf)/H^3 \quad (14)$$

$$\sigma_g = (6Edf)/H^2 = 4(\sigma_b) \quad (15)$$

From equation (15), it can be seen that the stress if four times larger than if the connection is considered as a simple cantilevered beam (equation 10). However, the diameter of the beam d and the modulus of elasticity E are still in the numerator, and the height H is squared and appears in the denominator, which is identical to the stress given by the equation (10). Thus, the stress relationship derived from the more rigorous model of the joint still supports the above conclusions.

Furthermore, from equation (13) it can be seen that at the center of the column there are no bending stresses. Consequently, a column-type joint, with varying diameters, such that the diameter at the center of the column is smaller than the diameter at both ends (i.e., like an hourglass), would be more uniformly stressed and would provide greater flexibility.

A yet more rigorous analysis would take into consideration the elasticity of the CCP and the PCB and its effect on reducing the magnitude of the internal forces and stresses. However, the relationship between the acting factors, i.e. the diameter, heighth, etc. will be similar to the above analysis.

A more detailed finite element analysis of similar joint structures was presented by E. A. Wilson, Honeywell, Phoenix, Ariz., and E. P. Anderson, Honeywell, Bloomington, Minn., in their paper entitled "An Analytical Investigation into Geometric Influence on Integrated Circuit Bump Strain," which was presented at the 33rd Electronic Components Conference, May 16-18, 1983, Orlando, Fla. (Proceedings page 320-327), incorporated by reference herein. This analysis confirms the advantages of columnar structures.

It is understood that by reducing the peak stresses as described above in a repetitive loading situation, the number of cycles required to produce failure is greatly increased.

From the foregoing evaluations, it can be seen that the life of the solder joints can be increased substantially by a relatively small increase in solder joint height. Likewise, a reduction in solder joint diameter will extend the life of the solder joints. A concomittant advantage in using joints of increased height and/or reduced diameter is the opportunity for increased packing density. The foregoing evaluations are helpful in predicting the general properties and performance to be expected from the devices and methods of this invention. However, it is also helpful to verify performance properties by empirical testing of the devices of this invention.

The foregoing advantages of reduced stresses and extended life in the solder joints and the opportunity for increased packing density are incorporated in the present invention which provides a device for the precise positioning of solder preform of slender cylindrical shapes at predefined locations. In the embodiment of the invention illustrated in FIG. 4, the interconnection preform placement device 20 includes a retaining member 22 of electrically nonconductive material having a configuration and size substantially the same as the chip carrier for which the preform placement device is used in mounting the chip carrier on a suitable substrate, such as a circuit board. The holder 22 has a central cut-out 24 to form a perimeter or bordering portion in which are spaced at predetermined locations a plurality of holes 26 which receive preforms 28 of solder in the shape of slender cylindrical columns, such as shown in FIG. 5. The retaining member may also herein be referred to as a "holder."

The location and positioning of the holes 26 on the retaining member 22 are determined by the spacing of the conductive contacts disposed on the edge of the chip carrier to be mounted. Generally, the height of each solder preform 28 will be somewhat taller than the thickness of the retaining member 22 such that the upper and lower edge portions of each solder preform 28 will extend above the corresponding surfaces of the retaining member, and in use these exposed surfaces will make physical contact with the corresponding conductive pads on the chip carrier and on the circuit board.

While not specifically shown in FIG. 4, the preform placement device is provided with appropriate means for properly locating and orienting the retaining member 22 with respect to the chip carrier and the circuit board so that the conductive pads on the chip carrier, the conductive pads on the circuit board and the column solder preforms are properly aligned. Such locating means are known, and may include a chamfered corner which mates with a similarly-configured surface on the chip carrier. One or more of the corners may have an indexing notch. Additionally, alignment pins may be provided on the bottom surface of the retaining member 22, or holes to accept pins which register with positioning holes provided on the circuit board. A combination of such positioning techniques may be incorporated into the holder 22.

It is possible to vary the composition of the solder material such that the solder preform will give or compress under the weight of the chip carrier to be mounted. This compressibility of the solder preform is important because the chip carrier and the circuit board are typically not truly flat so that the lengths of the solder columns must change during the soldering process to accommodate these irregularities.

The retaining member 22 may be made from any suitable material, and preferably is of an electrically-nonconductive material. The material may be a single sheet or layer of desired thickness, or may be a laminate of a plurality of thin sheets or layers of suitable material or may be a plurality of elements which form a sheet-like structure. Such material would include, but is not limited to, glass matt and high-temperature polymeric materials such as Ultem (Ultem is a trademark of General Electric Company.). The material of the retaining member 22 should be sufficiently rigid and temperature-resistant to maintain the solder preform's position during the soldering process.

Preferably there are two categories of retaining members, those that are removable and those that become a permanent part of the interconnection. The removable type could be dissolvable, frangible, segmented, or deformable without harming the preforms. The permanent or nonremovable type can be passive or can perform electrical, mechanical and/or thermal functions. The removable type can therefore be destroyed by dissolving or breaking apart. The glass matt embodiment can be physically pulled away in whole or piece by piece. The Ultem material can be dissolved by well-known chemical means without harming the preform or electrically conductive elements.

It is within the scope of the invention to make a segmented retaining member that can be stripped away after interconnection. The retaining member 22 in FIG. 4 can be provided with lines of weakness or cuts as shown at 29 in phantom line. In this way, the retaining member 22 may be removed in one or more pieces and directions. The retaining member may also originally be made from individual elements as will be discussed later.

Thus it can be seen that the removable retaining member may also be conductive such as an aluminum foil in order to maintain the position of the preforms during interconnection. It is important that such a retaining member not bond to the preforms during the process.

Finally, the retaining member can be made from a thin sheet of solder material which could melt and flow into the solder-like preforms during the soldering process.

The retaining member which remains in place should be generally nonconductive and relatively flexible so that it does not interfere with the motion of the preform columns. Additionally, it may provide an impedance-matched interconnection if it is a combination of conductive and dielectric materials so that it provides a transmission line or microstrip effect, or a coaxial type shield around the preforms.

In another embodiment the retaining member could be made from a nonconductive material which, however, becomes conductive when a specific voltage threshold is exceeded, this threshold being just above the normal operating voltage of the circuit. This type of retaining member would provide protection to the chip device by shorting out any potential damaging transient overvoltages which may result from electrostatic discharge or other electrical faults.

In some applications, it may be desirable to make the retaining member from a material which exhibits heat-recovery. This type of retaining member could be reinforced with glass fiber or the like to control its coefficient of thermal expansion, but locally the holes which are provided for retaining the solder-like columns could be fabricated so as to contract in diameter during soldering and thereby extrude the solder column up to meet the CCP and PWB.

Although the retaining member has been shown to position only interconnection preforms in FIGS. 4 and 7-10, it is understood that other elements could also be positioned by the retaining member and attached to the chip device and board. A heat-sink device could be carried in the central opening of the retaining member of FIG. 4 and bonded to the CCP and PWB during soldering. Similarly, a vibration damper, structural reinforcement, or a Peltier-type cooler could be positioned and attached to the CCP and the PWB. Also, an electrical ground plane could be positioned near the interconnection preforms to beneficially modify their electronic impedance characteristics similar to a microstrip board trace.

FIG. 4 shows a square peripheral array of interconnections. However, other patterns or arrays could also be accomplished by this invention. Any matrix of interconnections on a regular rectilinear format could be provided. Non-rectilinear or partially filled arrays could also be provided.

If the interconnections are arranged sufficiently close together, a random-type interconnection system could be produced. In this type of system, since the interconnection density is much higher than the density of the pads on the CCP and PWB, then statistically there will always be at least one interconnecting preform located between each pad set to be interconnected. The arrangement of the interconnections is completely random in this type of holder system. This type of retaining member may ideally be made from a plurality of elements bonded together, each having at least one aperture therethrough. The elements, such as 31 shown in phantom in FIG. 4, may be of uniform or random cross-section in order that they may be efficiently bundled and permanently or temporarily joined together such as by fusion or proper adhesive material to form a sheet-like structure. In such a bundled configuration the retaining member elements may be formed by continuously extruding the retaining member material over the preform, cutting the extruded composite into discrete pieces, bundling the axially-aligned pieces and preferably joining the retaining member material and then slicing the assembly at right angles to the axial alignment to make a preform placement device.

Also shown in the configuration shown in FIG. 4, the retaining member 22 can be ideally stamped from a sheet of material, or otherwise cut from sheet material. Quite possibly the retaining member fabricating process would provide for the simultaneous stamping of the holder shape and the central cut-out 24 and formation of the properly-spaced holes 26, and insertion of the solder preforms into the holes. Of course, it is possible that the production of the retaining member 22 can be achieved in a sequence of steps in which the retaining member with its cut-out and orientation surfaces is stamped from a sheet material, and subsequent techniques are used to form the holes into which the solder preforms are inserted. Other manufacturing methods such as molding or insert molding are within the scope of the invention.

The retaining member 22 may be fabricated from a sheet or a laminate of heat-recoverable material, whereby the retaining member is stamped from the material sheet, the holes formed therein, and the solder preforms positioned within the holes. Subsequently, the retaining member is heated to a temperature sufficient to cause the material to recover such that the diameters of the holes 26 are reduced, but at a temperature below the melting point of the solder preforms. The use of a heat-recoverable material for the retaining 22 affords the advantages that the holes can be formed to a predefined shape, such as an hourglass, with varying diameters, such that the dameter of the middle section is smaller than the diameter at the ends. These holes would be expanded to a uniform diameter larger than the diameter of the preforms so that the preforms can be more readily positioned in the holes, after which the retaining member 22 is heat-recovered, causing each hole to constrict to a size substantially identical to the diameter of the preform, thus securely gripping the preform within the retaining member. Furthermore, the use of a heat-recoverable material affords the advantage that in use, when heat is applied to effect the solder joint, such as by a solder reflow process, the firm gripping of the solder preforms by the heat-recovered retaining member material will impart the original hourglass shape of the holes to the preform, thus improving the flexibility of the column-type joints, and in turn reducing the stresses and improving the reliability of the joints.

It is also possible to further control the ultimate configuration of the solder joint by the use of a heat-recoverable material in the retaining member 22. This can be achieved in partially recovering the material, causing the holes to securely grip the preforms. Then, during the soldering process, sufficient heat is applied to cause the material of the retaining member to further recover, thereby further decreasing the diameter of the holes to apply a constrictive force onto the molten or softened preform. This will have a tendency to produce column joints of height greater than the thickness of the retaining member 22.

While the retaining member 22 has been shown in FIG. 4 as a perimeter configuration, it is possible that the retaining member can be a layer of material without any cut-outs therein, and in which the necessary number of solder preforms are properly located throughout the entire surface of the retaining member as necessitated by the number, location and configuration of the conductive pads to be joined.

The preforms 28 may be made of any suitable joint forming material, such as solder, filled solder, supported solder or conductive elastomer material which wll at least partially melt or soften then adhere to an electrically conductive element when contacted therewith and cooled. The preforms can be produced by any suitable technique, such as by the continuous extrusion of the solder material through appropriate-sized dies and cutting the extrudate to the proper lengths. The preforms may be molded. Filled solder is used to maintain the columnar configuration during the soldering process; particles of metallic or non-metallic material may be embedded in the solder preforms, such as shown in FIG. 6. For example, discrete pieces 30 of metallic material, such as pieces of copper, may be embedded in the solder preforms by mixing the particles in the composition prior to extrusion, and then extruding the mixture in a known fashion. As shown in FIG. 6, the discrete particles may be aligned along the longitudinal axis of the extrudate. This alignment can be achieved with appropriate techniques, such as the application of a magnetic force during the extrusion process, or simply by the shearing and other forces applied by the extruder on the extruding material.

The particles mixed into the solder should have a melting point above the melting point of the solder, and good metallurgical, mechanical and electrical properties. In addition to copper, discussed above, fillers could include nickel, iron, and metal-coated high-temperature polymer or glass films with a high aspect ratio. These materials could be discrete particles or continuous lengths with a single strand or many strands in each preform. Solder could completely coat the strands or fibers, or could be deposited only at the ends of inherently conductive fibers. Additionally, the interconnection bonding agent or solder could be added in a separate operation. Thus, continuous conductors or fiber bundles could be retained by the retaining member and then attachment would be accomplished by immersing the assembly in molten solder which will wick and wet the components and make the electrical and mechanical interconnection.

Additionally, the particles in the filled solder may be oriented in any other desirable alignment, and the relative content of the particles in the solder preforms, as well as the size of the particles relative to the height of each preform, can be tailored to the requirements of the joints to be formed. Furthermore, the surfaces of the solder preforms may be coated with a suitable flux, or the flux may be coated only on the end portions of the preform so that during the soldering process the flux will coat the respective contact areas on the conductive pads to ensure proper flow of the solder. The flux may also be incorporated within the preform.

The use of the preform placement device 20 in mounting a chip carrier 32 to a suitable substrate, such as a circuit board 34, is illustrated in FIGS. 7 and 8. The retaining member 22, with the solder preform 28 secured therein, is positioned between the lower surface of the chip carrier 32 and the opposing upper surface of the circuit board 34, and properly located so that the end portions of each solder preform 28 make contact with the conductive contacts on the chip carrier and the conducting land on the circuit board 34. Means may be provided for aligning or orienting the chip carrier 32 relative to the circuit board 34, such as by providing orientation holes 36 in the chip carrier which are vertically aligned with corresponding holes 38 in the circuit board and holes 39 in the preform placement device by inserting pins through the aligned holes 36, 38 and 39. Other alignment or orienting means can be used. After the soldering process, the ends of the column solder preforms 28 are securely bonded to their respective conductive contacts and lands on the chip carrier 32 and the circuit board 34, as shown in FIG. 8.

FIG. 4 illustrates a flat stamped retaining member but, of course, the holder could be formed by stamping, folding or molding into a cup-shaped structure into which the CCP could be accurately placed. Detent features could be provided as pressure-sensitive or hot-melt adhesives could be provided within the retaining member so that the chip carrier could be preassembled to the CCP before application to the PWB. This subassembly could then be located to the PWB using fixtures, pick and place equipment, alignment features such as holes or pins, or the like. Adhesives or pins could be provided in the center surfaces of this retaining member as discussed earlier with respect to FIG. 4 to maintain position during the soldering or reflowing operation.

FIG. 4 illustrates a single retaining member but, of course, these components could conveniently be supplied connected together like a bandolier for convenient assembly packaging and application.

During the soldering or reflowing process, it is understood that suitable means will be utilized to maintain good contacts between the conductive elements on the chip carrier 32 and the circuit board 34 until the joint has solidified. Techniques for maintaining this contact are known. Another technique for providing this retaining force is shown in FIGS. 9 and 10 and can be incorporated into the retaining member for the solder preforms.

As shown in FIG. 9, an illustrative number of solder preforms 28 are disposed in holes provided in the retaining member 40 which is made from a layer of heat-recoverable material, and each surface is formed with a depression or recess 42. Formation of the recess 42 causes the opposite surface of the retaining member to be raised in a correspondingly-shaped protrusion or bump 44. The elevated planar surface of the protrusion 44 is coated with a suitable adhesive 46. The recesses 42 and the protrusions 44 can be conveniently formed by a stamping operation in which appropriately-shaped dies are pressed onto the opposed surfaces of the holder 40, causing recesses 42 to be formed in one surface and forcing the material out in the form of protrusion 44 on the other surface, as shown more clearly in the cross-section of FIG. 10.

Once applied between the chip carrier 32 and the circuit board 34, the end portions of each solder preforms 28 make contact with the conductive elements 10 and 12 on the chip carrier and circuit board, and the adhesive 46 on the surfaces of the protrusions 44 make contact, respectively, with the opposed surfaces of the chip carrier and the circuit board, thus holding the chip carrier to the circuit board. During the soldering process, the application of heat causes the heat-recoverable material of the retaining member 40 to recover in a known fashion, causing the recesses 42 and the protrusions 44 to revert to the flat configuration of the retaining member, thus pulling the chip carrier 32 toward the circuit board 34 and causing the solder to wet the contact elements on each respective device.

The shape at the recesses and protrusions shown in FIGS. 9 and 10 are illustrative only; other configurations may be equally suitable. The trapezoidal configuration of the recesses 42 and protrusions 44 shown in the drawings are particularly advantageous in that they provide a relatively large flat surface onto which the adhesive 46 may be applied, and the form of the recesses and protrusions can be easily made in the retaining member 40. In use, the large-area adhesive layers provide a strong gripping force to the respective surfaces of the chip carrier 32 and the circuit board 34, and the contractive force produced by the recovering material of the retaining member 40 exerts sufficient force to pull the chip carrier down toward the circuit board 34. The shapes also aid in venting between chip and board. Obviously, adhesive can be put as well on flat retaining members, without any protrusions, simply to secure the device on the board and the CCP on the device (with or without heat-shrinking) or for vibration damping, etc., as discussed earlier.

Although the solder preforms considered thus far have been of slender cylindrical configurations, other shapes are equally suitable, depending upon the requirements of the mounting. Preforms with square, hexagonal or other shapes of cross-sections can be used.

Furthermore, some examples of other configurations are shown in FIGS. 11A–C, FIG. 12 and FIG. 13. The S-shape of the preforms shown in FIGS. 11A–C provides joints of greater flexibility which permit relatively large displacements between the chip carrier 32 and the circuit board 34 without inducing undue stresses in the fixed portions of the joint. With the reverse S-shape preform 48 shown in FIG. 11A, a substantially large contact area is afforded at the upper portions of the preform making contact with the conductive pads 10 and 12 on the chip carrier 32 and the circuit board 34. The preform 48 is supported by two parallel-disposed holder layers 50 and 52.

The S-shaped preform 54 of FIG. 11B affords the same advantages as the preform 48 of FIG. 11A and, additionally, provides two probe areas P and P$^1$ which may be used to test for electrical continuity of the connection. This configuration is particularly advantageous when used in making connections along the periphery of the chip carrier when the contacts are spaced along the edges of the chip carrier inasmuch as the probe areas are readily accessible. As with the preform 48, the preform 54 is supported by parallel-disposed retaining member layers 50 and 52. In fabricating the preforms 48 and 54 and positioning them into the retaining members 50 and 52, the preforms are initially straight elements which are inserted into the corresponding, vertically aligned holes in the retaining member layers 50 and 52 and the ends are bent into the configuration shown in FIGS. 11A and 11B.

The S-shaped preform 56 shown in FIG. 11C is provided in a single retaining member layer 58 having a thickness substantially greater than the individual retaining member layers 50 and 52 shown in FIGS. 11A and 11B. Otherwise, the preform 56 affords the same advantages as the preforms 48 and 54.

The preform 60 shown in FIG. 12 is of C-shape configuration which is suitably attached along the edge of the retaining member 58 by element 61 being inserted into the aperture in member 58. Due to its unique configuration the C-shape preform 60 is most advantageously used when disposed along the peripheral edges of the retaining member 58. The preform 60 provides a very substantial joint surface which may be used to test for electrical continuity between the chip carrier 32 and the circuit board 34.

Although the preforms have been generally described as being made of filled solder the preforms may also be made from supported solder or from a continuous length of conductive material such as wire with filled solder or supported solder material located at the ends thereof for interconnection purposes. In some methods the preforms may be solder or conductive elastomer. These materials may also be a continuous strand of conductive material with filled solder or supported solder column located at the ends thereof for interconnection purposes as will be appreciated with respect to FIGS. 11-13.

For maximum flexibility and resilience between the chip carrier 32 and the circuit board 34, the coiled spring configuration 62 shown in FIG. 13 is ideal. The preform 62 could be readily formed by extruding the filled solder composition as a continuous extrudate, forming it into a coiled configuration of suitable spring material of desired diameter and length, and appropriately holding each spring preform within the retaining member 58. The degree of resilience afforded by the preform 62 can be controlled in substantially the same fashion that the parameters regulating the performance of conventional springs are controlled, such as controlling the diametric sizes of each turn of the spring, the length of the spring and the diameter of the extrudate from which the spring is made. The spring configuration could also be made from a supported solder disclosed herein.

Since each solder preform is individually placed in a given location, the preform configuration can be tailored to meet the specific requirements of a particular joint. Thus, for example, the diameter and/or height of the cylindrical preform at certain locations can be different from the preforms at other locations to meet the specific needs of the joint being formed. Conceivably, each joint may be unique and may incorporate a different solder preform. Additionally, it is possible to combine different preform configurations, such as combining the cylindrical preforms with any of the preforms shown in FIGS. 11-13 to meet the specific needs for resilience and stress reduction in one or more particular solder joints.

FIG. 14 shows some examples of the supported solder preform embodiment of this invention. FIG. 14A shows a solder column supported by wire strands in the form of a wire braid 72. FIG. 14D shows the column supported by a wire strand 82 wrapped around the column in a spiral fashion. In the wire braid and the spiral wire wrap embodiments, the diameter of the column and the spacing between the wires are selected so that the surface tension of the solder used relative to the wire used will maintain the substantially columnar shape of the solder when molten. FIG. 14B shows a supported solder column 91 using a metal tape or ribbon 92. FIG. 14C shows the supported solder column after the connection has been made wherein it can be seen that the column shape of the supported solder has been substantially maintained while the solder formed fillets 94 at interconnect pads 10 and 12. The solder in the supported solder column flows slightly to form the fillets and the column acts as a reservoir of solder which is slightly depleted as seen at fillet 95 between the tape support. This characteristic of the supported solder columns provides manufacturing process advantages as well as columns of improved flexibility. An example of such a tape found particularly useful for interconnect pads spaced on 0.050 inch centers is a copper tape 0.003 inch thick and 0.013 inch wide wrapped around a solder column 0.020 to 0.025 inch in diameter with 0.008 to 0.010 inch space between wraps of the tape. It should be noted that the supported solder colums may be made using filled solder in place of the conventional solder.

The supported solder can be made by applying the support strand or tape to the outside of a column of solder, e.g. a solder wire. In this method support strands can be braided or wrapped around a solder wire and the wrapped solder wire then cut into lengths to form columns of a desired dimension useful in this invention. Similarly a metal tape can be wrapped around the solder wire and the wrapped solder wire cut to desired lengths. The supported solder can also be made by dipping the preformed support, such as a wire braid or a spiraled wire or tape, in molten solder to fill the interior space in the support with solder then solidifying the solder. This method can likewise be done in long sections which are then cut to lengths required to form the columns useful in this invention. In this fashion the supported solder columns can be formed in situ in the retaining member of this invention. For example, a spiral metal tape can be placed in the apertures of the retaining member then filled with molden solder, such as in wave soldering operation, then cooled. The supported solder column in the retaining means will then function in forming interconnections from which the retaining means can be removed if desired. The formation of supported solder columns in situ could also be done simultaneously with assembling the electrically conductive elements, whereby the solder support such as a spiral metal tape, in the retaining means is filled and the connections formed at the ends of the supported solder column all in one soldering operation. It has been found that in some cases when a solder wire is wrapped with a tape, it is useful to reflow the solder then cut the desired length columns for use in this invention and thereby discard any portions thereof that may not have sufficient solder therein.

The interconnection preform placement device of the present invention provides a unique and convenient technique for accurately positioning a plurality of preforms between a chip carrier and a circuit board to which the carrier is mounted. The use of cylindrical column preforms of solder results in solder joints of low bending stiffness and hence low shear stresses, which contribute to high fatigue resistance in the joints. The use of the column-shaped preform in the present invention ensures that the desirable column configurations will be retained during the soldering process and that the formed solder joints will be of column shape having low shear stresses distributed therethrough.

In addition to the embodiment of FIGS. 9 and 10 described above, the interconnection preform placement device may have a layer of pressure-sensitive adhesive on its surfaces, with or without a "release" paper or cover. This adhesive will maintain the device on the circuit board and the chip package on the device during handling prior to the soldering or reflowing process. The adhesive is applied in such a way as not to interfere with the soldering or reflowing process.

The retaining member may be made of a suitable high-temperature material capable of sustaining the heat applied during the soldering or reflowing process and be of an electrically insulating material to be left in place after soldering to provide an electrical insulator and an evironmental seal. Alternatively, the retaining member may be made of material which is heat-soluble, chemically soluble, or disintegrable such that after soldering the retaining member can be dissolved or disintegrated and removed from the mounting to provide clearance for flux removal, for instance, or for other procedures to complete the installation.

It will be appreciated that while this invention has been illustrated by embodiments of slender cylindrical column, the devices, articles, methods and composition of this invention are equally useful to form connections between electrically conductive elements where the joint forming material need not be an elongate column but can be a disk, wafer or other configuration where the width is greater than the length or height, such as in applicatons where compact spacing or current speed is more important than thermal cycling. It will also be appreciated that this invention is useful with other conventional processing methods, for example, the interconnect points on the electrically conductive elements or the ends of the preforms can be coated, for example, by a screening process, with a solder cream to enhance the formation or efficiency of the connection.

The concepts embodied in the present invention may be adapted for use in attaching a chip to a chip carrier or a chip directly to a circuit board, or to attach leaded CCPs or hybird thick-film-type chip carriers to circuit boards. Multiple preform placement devices or larger-scale placement devices can accommodate the simultaneous bonding of numerous chip carrier packages. Further, the interconnection preform placement device may be placed between two circuit boards to interconnect vertically the conductive pads of boards.

While preferred embodiments of the invention have been illustrated and described, it will be appreciated that variations therefrom may be made without departing from the scope of the invention as defined in the appended claims.

What is claimed is:

1. A device for providing a plurality of discrete quantities of preformed solder material for forming connections between electrically conductive elements comprising:
    a retaining member having a plurality of apertures therein spaced to correspond to preselected points on the electrically conductive elements; and
    preforms of solder material disposed in or supported by the apertures whereby the ends of the preforms are adapted to contact preselected points on the electrically conductive elements and wherein the solder material comprises filled solder which contains from about 20% to about 80% by weight based on the total weight of the solder-filler mixture of a filler which is solid at a temperature at which the solder is molten or supported solder and wherein the filled solder or supported solder, separate from the retaining member and apertures thereof, substantially retains its preform physical shape while the solder is in a molten state.

2. A device according to claim 1 wherein the preform of solder material comprises filled solder which substantially retains its preform physical shape while the solder is in a molten state.

3. A device according to claim 2 wherein the filled solder comprises solder within which is disposed discrete particles or filaments which are of a material which is solid at a temperature at which the solder is molten.

4. A device according to claim 2 in combination with an electrically conductive element wherein the preforms are bonded at one end to preselected points on the electrically conductive element.

5. A device according to claim 1 wherein the preform of solder material comprises supported solder which substantially retains its preform physical shape while the solder is in a molten state.

6. A device according to claim 5 wherein the support for the solder comprises a spiral metalic wire or tape.

7. A device according to claim 5 in combination with an electrically conductive element wherein the preforms are bonded at one end to preselected points on the electrically conductive element.

8. A device according to claim 1 wherein the preform of solder material has a height dimension greater than its transverse cross-sectional dimension.

9. A device according to claim 1 wherein the retaining member comprises a combination of conductive and dielectric materials.

10. A device according to claim 1 wherein the retaining member comprises a laminate.

11. A device according to claim 1 wherein the retaining member comprises a dissolvable material.

12. A device according to claim 1 wherein the retaining member comprises a segmented or frangible material.

13. A device according to claim 1 wherein the retaining member provides overvoltage protection for at least one of the electrically conductive elements.

14. A device according to claim 1 wherein the retaining member provides a heat-sink for the electrically conductive elements.

15. A device according to claim 1 wherein the retaining member comprises a heat-recoverable material.

16. A device according to claim 1 in combination with an electrically conductive element wherein the preforms are bonded at one end to preselected points on the electrically conductive element.

17. A method for forming a resilient connection for connection preselected points of first and second electrically conductive elements comprising:
    positioning a first electrically conductive element in alignment with one side of a retaining member having apertures spaced to correspond to the preselected points on the electrically conductive elements and having disposed in said apertures preforms of solder material; and
    effecting a bond between one end of the preforms and the preselected points on the first electrically conductive element;
    wherein the preforms of solder material are filled solder containing from about 20% to about 80% by weight based on the total weight of the solder-filler mixture of a filler which is solid at a temperature at which the solder is molten or supported solder which, separate from the retaining member and apertures thereof, substantially retains its preform physical shape while the solder is in a molten state.

18. A method according to claim 17 which further comprises:
    positioning a second electrically conductive element in alignment with the opposite side of the retaining member; and
    effecting a bond between the other end of the preforms and the preselected points on the second electrically conductive element.

19. A method according to claim 18 wherein the bonds between ends of the preforms and the preselected points on the first electrically conductive element and the preselected points on the second electrically conductive member are effected simultaneously.

20. A method according to claim 19 comprising the further step of removing the retaining member after the preforms are bonded to both the first and second electrically conductive elements.

21. A method according to claim 18 comprising the further step of removing the retaining member after the preforms are bonded to both the first and second electrically conductive elements.

22. A method according to claim 17 wherein the preforms comprise filled solder or supported solder.

23. A method according to claim 22 wherein the preforms comprise filled solder which comprises solder within which is disposed discrete particles or filaments which are of a material which is solid at a temperature at which the solder is molten.

24. A method according to claim 22 wherein the preforms comprises supported solder wherein the support for the solder is a spiral metalic wire or tape.

25. A method according to claim 22 wherein the retaining member comprises a heat-recoverable material and further comprising adhering the retaining member to the electrically conductive elements, then effecting recovery of the material to pull the electrically conductive elements toward each other.

26. A method according to claim 17 which further comprises the step of removing the retaining member.

27. A method according to claim 26 which further comprises:
positioning, after the retaining member has been removed, a second electrically conductive element in alignment with the other ends of the preforms bonded to the first electrically conductive element; and effecting a bond between the other end of the preforms and the preselected points on the second electrically conductive element.

* * * * *